(12) United States Patent
Lee et al.

(10) Patent No.: US 12,069,889 B2
(45) Date of Patent: Aug. 20, 2024

(54) WHITE ORGANIC LIGHT EMITTING DEVICE COMPRISING REFLECTIVE LAYER AND DISPLAY APPARATUS INCLUDING THE SAME

(71) Applicant: SAMSUNG ELECTRONICS CO., LTD., Suwon-si (KR)

(72) Inventors: Sunghoon Lee, Seoul (KR); Wonjae Joo, Seongnam-si (KR); Sunjin Song, Seoul (KR); Hyun Koo, Seongnam-si (KR); Sunghyun Han, Pohang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 191 days.

(21) Appl. No.: 17/154,314

(22) Filed: Jan. 21, 2021

(65) Prior Publication Data

US 2021/0288290 A1 Sep. 16, 2021

(30) Foreign Application Priority Data

Mar. 13, 2020 (KR) .................. 10-2020-0031306

(51) Int. Cl.
*H10K 50/856* (2023.01)
*H10K 50/15* (2023.01)
*H10K 50/16* (2023.01)
*H10K 50/17* (2023.01)

(52) U.S. Cl.
CPC ........... *H10K 50/856* (2023.02); *H10K 50/15* (2023.02); *H10K 50/16* (2023.02); *H10K 50/171* (2023.02)

(58) Field of Classification Search
CPC ............ H01L 51/5271; H01L 27/3211; H01L 27/3216
See application file for complete search history.

(56) References Cited

U.S. PATENT DOCUMENTS

| 8,614,698 | B2 | 12/2013 | Desieres et al. |
| 10,074,698 | B2 | 9/2018 | Shen et al. |
| 10,431,632 | B2 | 10/2019 | Hatano |
| 10,615,372 | B2 | 4/2020 | Joo et al. |
| 2018/0097202 | A1 | 4/2018 | Forrest et al. |
| 2019/0198817 | A1* | 6/2019 | Joo ................. H01L 33/465 |
| 2020/0058905 | A1* | 2/2020 | Kyoung ........... H01L 51/5265 |

(Continued)

FOREIGN PATENT DOCUMENTS

| KR | 1020090091706 A | 8/2009 |
| KR | 101960759 B1 | 3/2019 |
| KR | 1020190076832 A | 7/2019 |

*Primary Examiner* — Daniel Whalen
(74) *Attorney, Agent, or Firm* — Sughrue Mion, PLLC

(57) ABSTRACT

A light emitting device includes a first electrode; a white organic light emission structure provided on the first electrode; a second electrode provided on the white organic light emission structure; and a reflective layer provided on an opposite side of the first electrode from the white organic light emission structure and including a first reflective region, a second reflective region, and a third reflective region having different heights from one another and forming different separation distances from the second electrode. A plurality of recesses may be provided in at least one of the first reflective region, the second reflective region, and the third reflective region on a surface of the reflective layer, and thus the color purity of the light emitting device may be improved.

23 Claims, 11 Drawing Sheets

(56) References Cited

U.S. PATENT DOCUMENTS

| | | |
|---|---|---|
| 2020/0227685 A1* | 7/2020 | Kyoung ................. H10K 50/16 |
| 2020/0241353 A1 | 7/2020 | Lee et al. |
| 2020/0243800 A1* | 7/2020 | Joo ....................... H10K 50/15 |
| 2020/0404037 A1 | 12/2020 | Garmark et al. |
| 2021/0020868 A1* | 1/2021 | Ikeda ................. H01L 51/5265 |

* cited by examiner

WHITE ORGANIC LIGHT EMITTING DEVICE COMPRISING REFLECTIVE LAYER AND DISPLAY APPARATUS INCLUDING THE SAME

CROSS-REFERENCE TO RELATED APPLICATION

This application is based on and claims priority under 35 U.S.C. § 119 to Korean Patent Application No. 10-2020-0031306, filed on Mar. 13, 2020, in the Korean Intellectual Property Office, the disclosure of which is incorporated by reference herein in its entirety.

BACKGROUND

1. Field

The disclosure relates to a light emitting device and a display apparatus including the light emitting device, and more particularly to, an organic light emitting device having a reflective layer including a recess and a micro cavity formed as an electrode and an organic light emitting display apparatus.

2. Description of Related Art

An organic light emitting device (OLED) is a display apparatus that forms an image via light emission according to a combination of holes supplied from an anode and electrons supplied from a cathode in an organic emission layer. The OLED has excellent display characteristics such as a wide viewing angle, a fast response speed, a thin thickness, a low manufacturing cost, and a high contrast.

Further, the OLED may emit a desired color according to selection of an appropriate material for the organic emission layer. According to this principle, it may be possible to manufacture a color display apparatus by using an OLED. For example, an organic emission layer of a blue pixel may include an organic material that generates blue light, an organic emission layer of a green pixel may include an organic material that generates green light, and an organic emission layer of a red pixel may include an organic material that generates red light. Also, in an RGB OLED method, a plurality of organic materials which respectively generate blue light, green light, and red light are arranged in one organic emission layer, and in a white OLED method, pairs of two or more kinds of organic materials are arranged in a complementary relationship with each other to implement a white OLED (W-OLED).

Although the W-OLED method is advantageous for large area displays in terms of process characteristics, a color filter is necessary to generate a color for each pixel, and thus, the efficiency and color purity of a display using this method may deteriorate. Although the RGB OLED method is relatively excellent in terms of efficiency and color purity, a fine metal mask (FMM) process is required for manufacturing a light emitting device, and thus, it may be difficult to manufacture a large area display.

SUMMARY

Provided is a white organic light emitting device (W-OLED) having improved color purity.

Provided is a display apparatus including a W-OLED having improved color purity.

Additional aspects will be set forth in part in the description which follows and, in part, will be apparent from the description, or may be learned by practice of embodiments of the disclosure.

In accordance with an aspect of the disclosure, a light emitting device includes a first electrode; a white organic light emission structure provided on the first electrode; a second electrode provided on the white organic light emission structure; and a reflective layer provided on an opposite side of the first electrode from the white organic light emission structure, the reflective layer including a first reflective region, a second reflective region, and a third reflective region having different heights from one another and forming different separation distances from the second electrode.

A plurality of recesses may be provided on a surface of the reflective layer in at least one of the first reflective region, the second reflective region, and the third reflective region.

A height of the first reflective region may be lower than a height of the second reflective region, and a height of the second reflective region may be lower than a height of the third reflective region.

The plurality of recesses may be provided in the first reflective region.

The plurality of recesses may be provided in the second reflective region.

A size of each of the plurality of recesses may be less than a wavelength of a light generated from the white organic light emission structure.

Adjacent recesses of the plurality of recesses may be periodically arranged and may be spaced apart from each other by a predetermined arrangement distance in a direction along the surface of the reflective layer.

A depth of each of the plurality of recesses may be less than the predetermined arrangement distance between the adjacent recesses of the plurality of recesses.

The first electrode may include a transparent electrode, and the second electrode may include a semi-transmissive electrode that reflects part of incident light and transmits the remaining part of the incident light.

The second electrode may include a reflective metal, and a thickness of the second electrode may be about 10 nm to about 20 nm.

The first electrode may include a transparent electrode and the second electrode comprises a reflective electrode, and the reflective layer may include a semi-transmissive layer that reflects part of incident light and transmits the remaining part of the incident light.

The reflective layer may include silver (Ag) or an alloy containing silver.

A depth of each of the plurality of recesses may be about 10 nm to about 100 nm.

A diameter of each of the plurality of recesses may be about 100 nm.

An arrangement period of the plurality of recesses may be about 100 nm to about 150 nm.

The white organic light emission structure may include a hole injection layer provided on the first electrode; a hole transport layer provided on the hole injection layer; a white organic light emission layer provided on the hole transport layer; an electron transport layer provided on the white organic light emission layer; and an electron injection layer provided on the electron transport layer.

The white organic light emission layer may include a first organic light emission layer emitting light of a first wavelength; a second organic light emission layer provided on the first organic light emission layer and emitting light of a second wavelength; and a third organic light emission layer provided on the second organic light emission layer and emitting light of a third wavelength.

A dielectric layer may be further provided between the reflective layer and the first electrode.

The dielectric layer may fill a periphery of the plurality of recesses.

In accordance with an aspect of the disclosure, a display apparatus includes a plurality of pixels, wherein each of the plurality of pixels includes a first electrode; a white organic light emission structure provided on the first electrode; a second electrode provided on the white organic light emission structure; and a reflective layer provided on an opposite side of the first electrode from the white organic light emission structure, the reflective layer including a first reflective region, a second reflective region, and a third reflective region having different heights from one another and forming different separation distances from the second electrode.

In accordance with an aspect of the disclosure, a light emitting device includes a first electrode; a second electrode provided on one side of the first electrode; and a reflective layer provided on an opposite side of the first electrode from the one side, the reflective layer including a first region and a second region, wherein a first distance between the second electrode and the first region of the reflective layer is greater than a second distance between the second electrode and the second region of the reflective layer.

The light emitting device may further include a light emission layer provided between the first electrode and the second electrode, the light emission layer being configured to emit light having a plurality of wavelengths.

The first distance may correspond to a first resonance of a first portion of the emitted light having a first wavelength and the second distance may correspond to a second resonance of a second portion of the emitted light having a second wavelength different from the first wavelength.

The first region of the reflective layer may include a plurality of recesses provided on a surface of the reflective layer.

The emitted light having the first wavelength may be reflected by the reflective layer without propagating into the plurality of recesses, and the emitted light having the second wavelength may propagate into the plurality of recesses without being reflected by the reflective layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
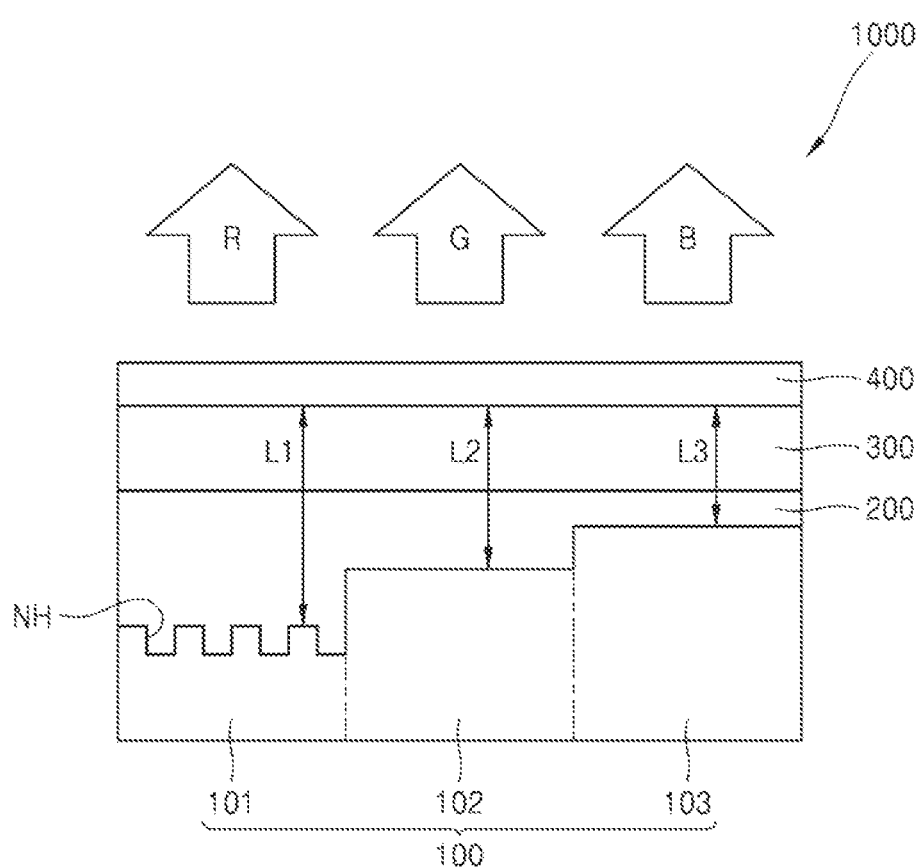
FIG. 1 is a lateral cross-sectional view schematically showing a structure of a light emitting device according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, with reference to the accompanying drawings, a light emitting device and a display apparatus including the light emitting device will be described in detail. Like reference numerals refer to like elements throughout, and in the drawings, sizes of elements may be exaggerated for clarity and convenience of explanation.

Terms such as "first" and "second" may be used to describe various components, but the components should not be limited by the terms. The terms are used only to distinguish one component from another component. The light emitting device and the display apparatus including the light emitting device may be implemented in various different forms and are not limited to the embodiments described herein.

Throughout the specification, when a portion "includes" a certain component, it means that the component may not exclude other components but may further include other components, unless otherwise stated.

Figure 2:
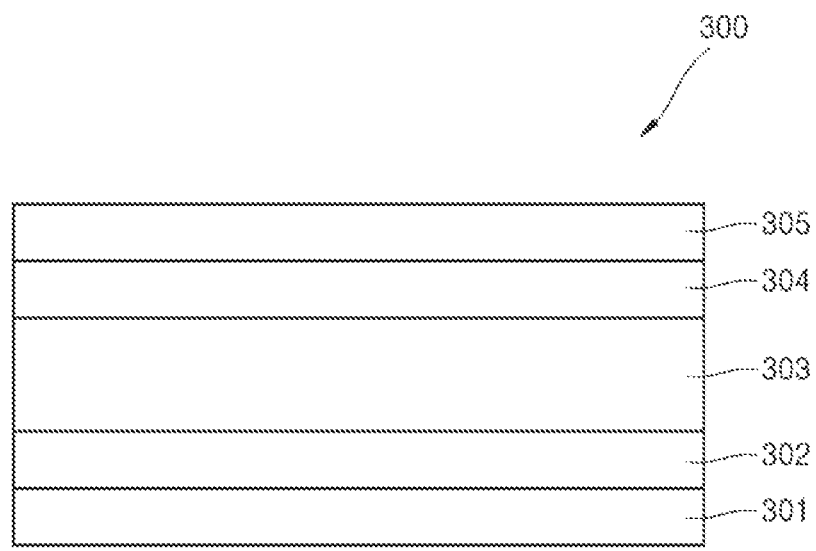
FIG. 2 is a lateral cross-sectional view schematically showing a structure of a white organic emission structure of FIG. 1.
Figure 3:
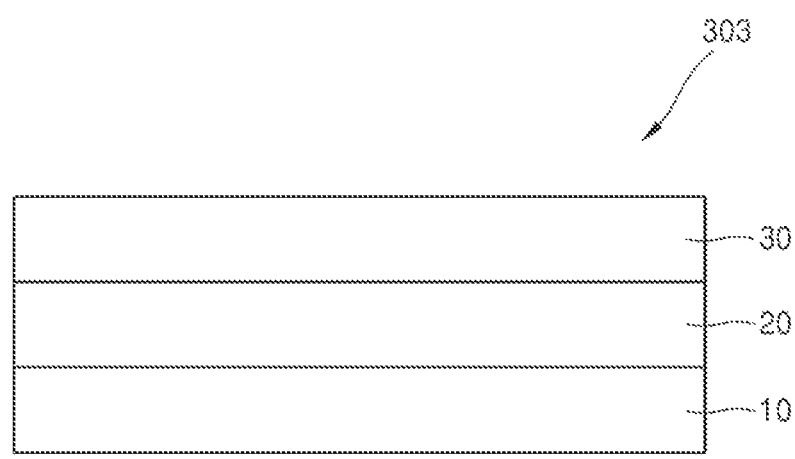
FIG. 3 is a lateral cross-sectional view schematically showing a structure of a white organic emission layer of FIG. 2.

FIG. 1 is a lateral cross-sectional view schematically showing a structure of a light emitting device 1000 according to an embodiment. FIG. 2 is a lateral cross-sectional view schematically showing a structure of a white organic emission structure 300 (i.e., a white organic light emission structure) of FIG. 1. FIG. 3 is a lateral cross-sectional view schematically showing a structure of a white organic emission layer 303 (i.e., a white organic light emission layer) of FIG. 2.

Referring to FIG. 1, the light emitting device 1000 may include a first electrode 200, the white organic emission structure 300 provided on the first electrode 200, a second electrode 400 provided on the white organic emission structure 300 and a reflective layer 100 provided below the first electrode 200. In other words, the reflective layer 100 may be provided on an opposite side of the first electrode 200 from the white organic emission structure 300. The reflective layer may include a first reflective region 101, a second reflective region 102, and a third reflective region 103 having different heights to form different separation distances from the second electrode 400.

The light emitting device 1000 may be an organic light emitting diode (OLED). For example, referring to FIG. 2, the white organic emission structure 300 may include a hole injection layer 301, a hole transport layer 302 provided on the hole injection layer 301, the white organic emission layer 303 provided on the hole transport layer 302, an electron transport layer 304 provided on the white organic emission layer 303, and an electron injection layer 305 provided on the electron transport layer 304. In addition, the white organic emission structure 300 may include various additional layers as necessary. For example, the white organic emission structure 300 may further include an electron block layer between the hole transport layer 302 and the white organic emission layer 303, and may also further include a hole block layer between the white organic emission layer 303 and the electron transport layer 304. In this structure, holes provided through the hole injection layer 301 and the hole transport layer 302 and electrons provided through the electron injection layer 305 and the electron transport layer 304 may combine in the white organic emission layer 303 to generate light.

In addition, referring to FIG. 3, the white organic emission layer 303 may include a first organic emission layer 10 emitting light of a first wavelength, a second organic emission layer 20 provided on the first organic emission layer 10 and emitting light of a second wavelength, and a third organic emission layer 30 provided on the second organic emission layer 20 and emitting light of a third wavelength. A wavelength of the light generated in each of the first, second, and third organic emission layers 10, 20, and 30 may be respectively determined according to an energy band gap of a light emitting material included in each of the first, second, and third organic emission layers 10, 20, and 30. For example, the first organic emission layer 10 may include a red emission material. In addition, the second organic emission layer 20 may include a green emission material. Furthermore, the third organic emission layer 30 may include a blue emission material. Accordingly, red light, green light, and blue light may be generated in the first, second, and third organic emission layers 10, 20, and 30, respectively, and a white light may be formed by mixing the three lights. Meanwhile, the white organic emission layer 303 may include various additional layers as necessary. For example, at least one of the additional electron transport layer and hole transport layer may be further provided between the first organic emission layer 10 and the second organic emission layer 20. In addition, at least one of the additional electron transport layer and hole transport layer may be further provided between the second organic emission layer 20 and the third organic emission layer 30.

However, the structure of the OLED described above is only an example of the light emitting device 1000, and the light emitting device 1000 is not limited to the OLED only. For example, the structure and principle of the light emitting device 1000 may also be applied to an inorganic light emitting diode. Hereinafter, for convenience, it will be described that the light emitting device 1000 is the OLED.

Referring to FIG. 1, the first electrode 200 disposed between the reflective layer 100 and the white organic emission structure 300 is a transparent electrode having a property of transmitting light (e.g., visible light), and may serve as an anode providing holes. A part of the first electrode 200 in contact with the reflective layer 100 may include a step shape. For example, partial regions of the first electrode 200 in contact with the reflective layer 100 may have different heights corresponding to the different heights of the first reflective region 101, the second reflective region 102, and the third reflective region 103 of the reflective layer 100. Accordingly, separation distances between the second electrode 400 and each of the first, second, and third reflective regions 101, 102, 103 are different, but a distance between the lower surface of the reflective layer 100 and the upper surface of the second electrode 400 may be constant.

The second electrode 400 arranged on the white organic emission structure 300 may be a semi-transmissive electrode that reflects part of light and transmits the remaining part thereof and may serve as a cathode providing electrons. To this end, the first electrode 200 may include a material having a relatively high work function, and the second electrode 400 may include a material having a relatively low work function. For example, the first electrode 200 may include transparent conductive oxide, such as indium tin oxide (ITO), indium zinc oxide (IZO), or aluminum zinc oxide (AZO). In addition, the second electrode 400 may include a very thin reflective metal. For example, the second electrode 400 may be a mixed layer of silver (Ag) and magnesium (Mg) or a mixed layer of aluminum (Al) and lithium (Li). In addition, the entire thickness of the second electrode 400 may be about 10 nm to about 20 nm. Because the thickness of the second electrode 400 is very thin, part of light of the white organic emission structure 300 may pass through the second electrode 400. In this case, the light of the white organic emission structure 300 may be emitted toward the upper portion of the light emitting device 1000 as shown in FIG. 1.

As another example, the first electrode 200 may be a transparent electrode, and the second electrode 400 may be a reflective electrode. In this case, the reflective layer 100 may have a semi-transmissive property that reflects part of light and transmits the remaining part thereof. Accordingly, the light of the white organic emission structure 300 may be emitted toward the lower portion of the light emitting device 1000 as shown in FIG. 1. Hereinafter, the function of the reflective layer 100 will be described by way of example that the light of the white organic emission structure 300 is emitted toward the upper portion of the light emitting device 1000.

The reflective layer 100 having different heights for each region may form micro cavities of various lengths together with the second electrode 400. For example, the first region 101 of the reflective layer 100 and the second electrode 400 may together form a first micro cavity L1 having a first resonance wavelength A1. Also, the second region 102 of the reflective layer 100 and the second electrode 400 may together form a second micro cavity L2 having a second resonance wavelength A2. Furthermore, the third region 103 of the reflective layer 100 and the second electrode 400 may together form a third micro cavity L3 having a third resonance wavelength A3. The light of the white organic emission structure 300 may reciprocate and resonate between the reflective layer 100 and the second electrode 400. At this time, after the light resonates between the first region 101 of the reflective layer 100 and the second electrode 400, light corresponding to the first resonance wavelength A1 (e.g., a red light R) may be emitted to the outside through the second electrode 400. In addition, after the light resonates between the second region 102 of the reflective layer 100 and the second electrode 400, light corresponding to the second resonance wavelength A2 (e.g., a green light G) may be emitted to the outside through the second electrode 400. Furthermore, after the light resonates between the third region 103 of the reflective layer 100 and the second electrode 400, light corresponding to the third resonance wavelength A3 (e.g., a blue light B) may be emitted to the outside through the second electrode 400.

The first, second, and third resonance wavelengths A1, A2, and A3 may be respectively determined by the optical thickness of the first, second, and third micro cavities L1, L2, and L3. For example, the optical thickness of the first micro cavity L1 may be $n*(\lambda1/2)$ (n is a natural number). The optical thicknesses of the first, second, and third micro cavities L1, L2, and L3 may be determined by the optical thicknesses of the white organic emission structure 300 and the first electrode 200. Here, the optical thicknesses of the white organic emission structure 300 and the first electrode 200 are not simple physical thicknesses, but are the thicknesses considering the refractive index of materials of the white organic emission structure 300 and the first electrode 200. As shown in FIG. 1, the optical thicknesses of the first, second, and third micro cavities L1, L2, and L3 may be adjusted by adjusting the optical thickness of the first electrode 200 while maintaining the optical thickness of the white organic emission structure 300 constant. The optical thickness of the first electrode 200 may be determined according to the heights of the first, second, and third regions 101, 102, and 103 of the reflective layer 100. The optical thickness of the first electrode 200 may be determined such that the first, second, and third resonance wavelengths A1, A2, and A3 coincide with the center wavelengths of the red light R, green light G, and blue light B, respectively. For example, the height of the first reflective region 101 of the reflective layer 100 may be lower than the height of the second reflective region 102 such that the optical thickness of the first micro cavity L1 is greater than the optical thickness of the second micro cavity L2. In addition, the height of the second reflective region 102 of the reflective layer 100 may be lower than the height of the third reflective region 103 such that the optical thickness of the second micro cavity L2 is greater than the optical thickness of the third micro cavity L3.

The reflective layer 100 may include metal. For example, the reflective layer 100 may include silver (Ag) or an alloy including silver. However, the disclosure is not limited thereto, and the reflective layer 100 may include metal other than silver.

Meanwhile, a plurality of recesses NH may be provided in at least one of the first reflective region 101, the second reflective region 102, and the third reflective region 103 on the surface of the reflective layer 100. For example, among the first reflective region 101, the second reflective region 102, and the third reflective region 103, the plurality of recesses NH may be provided in the first reflective region 101 as shown in FIG. 1. For example, the plurality of recesses NH may be provided only in the first reflective region 101.

The plurality of recesses NH may be a plurality of trench structures formed in the surface of the reflective layer 100. The cross sections of the plurality of recesses NH may be circular. However, the disclosure is not limited thereto, and the cross sections of the plurality of recesses NH may include polygons such as triangles and squares. The size of the plurality of recesses NH may be less than the wavelength of the light generated from the white organic emission structure 300. The plurality of recesses NH may be spaced apart from each other by a predetermined distance in the horizontal direction (i.e., in a direction along the surface of the reflective layer 100) and may be periodically arranged. For example, the arrangement period of the plurality of recesses NH may be about 100 nm to about 150 nm. In this case, the horizontal direction means a direction perpendicular to a thickness direction in which the reflective layer 100, the first electrode 200, the white organic emission structure 300, and the second electrode 400 are stacked. However, the plurality of recesses NH is not limited to being periodically arranged, and the plurality of recesses NH may be irregularly arranged. The depth of the plurality of recesses NH may be less than the arrangement period of the plurality of recesses NH. For example, the arrangement period of the plurality of recesses NH may be 100 nm or more, and the depth thereof may be about 10 nm to 100 nm or less. The diameter of the plurality of recesses NH may be equal to or less than the arrangement period of the plurality of recesses NH. For example, the arrangement period of the plurality of recesses NH may be 100 nm or more, and the diameter thereof may be 100 nm. The function of the plurality of recesses NH will be described later with reference to FIGS. 4 and 5.

Figure 4:
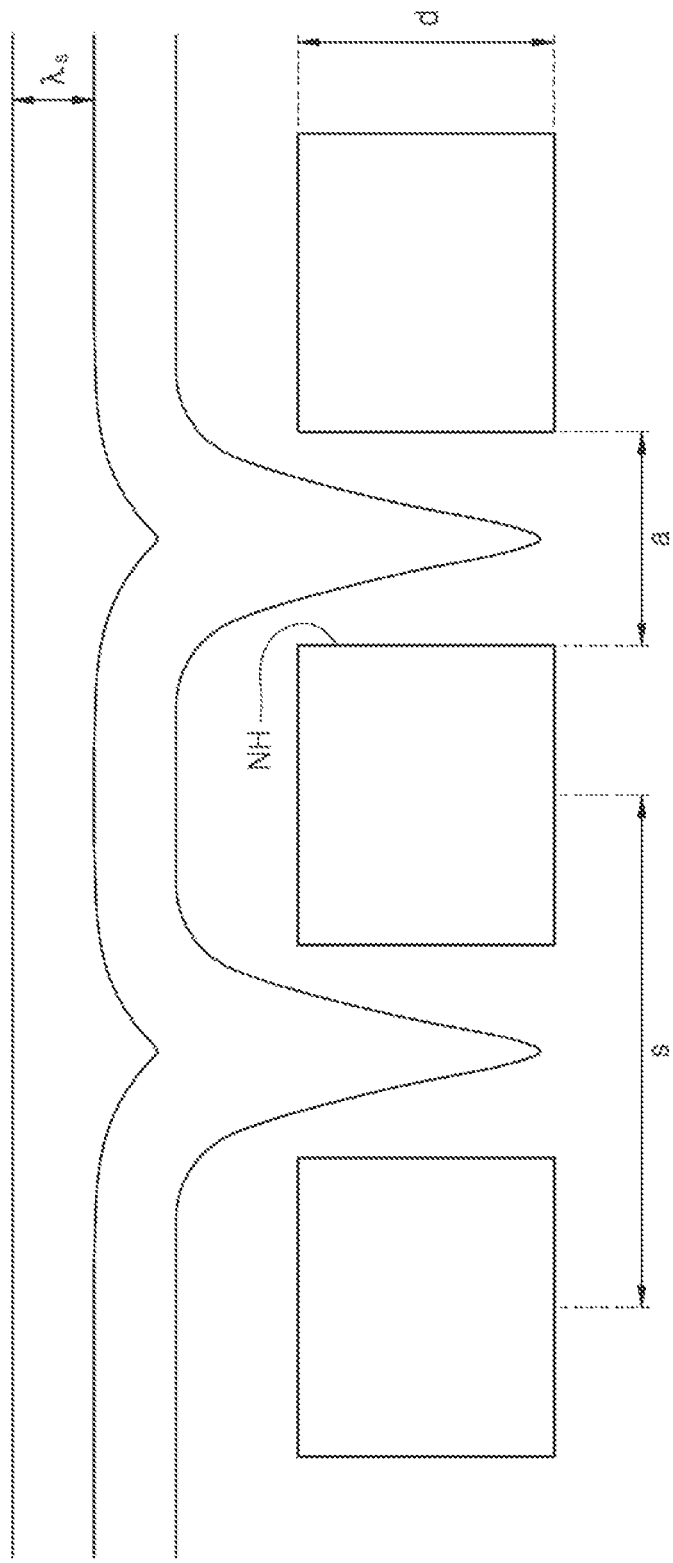
FIG. 4 schematically shows the effect of a plurality of recesses of FIG. 1 on light of a short wavelength.
Figure 5:
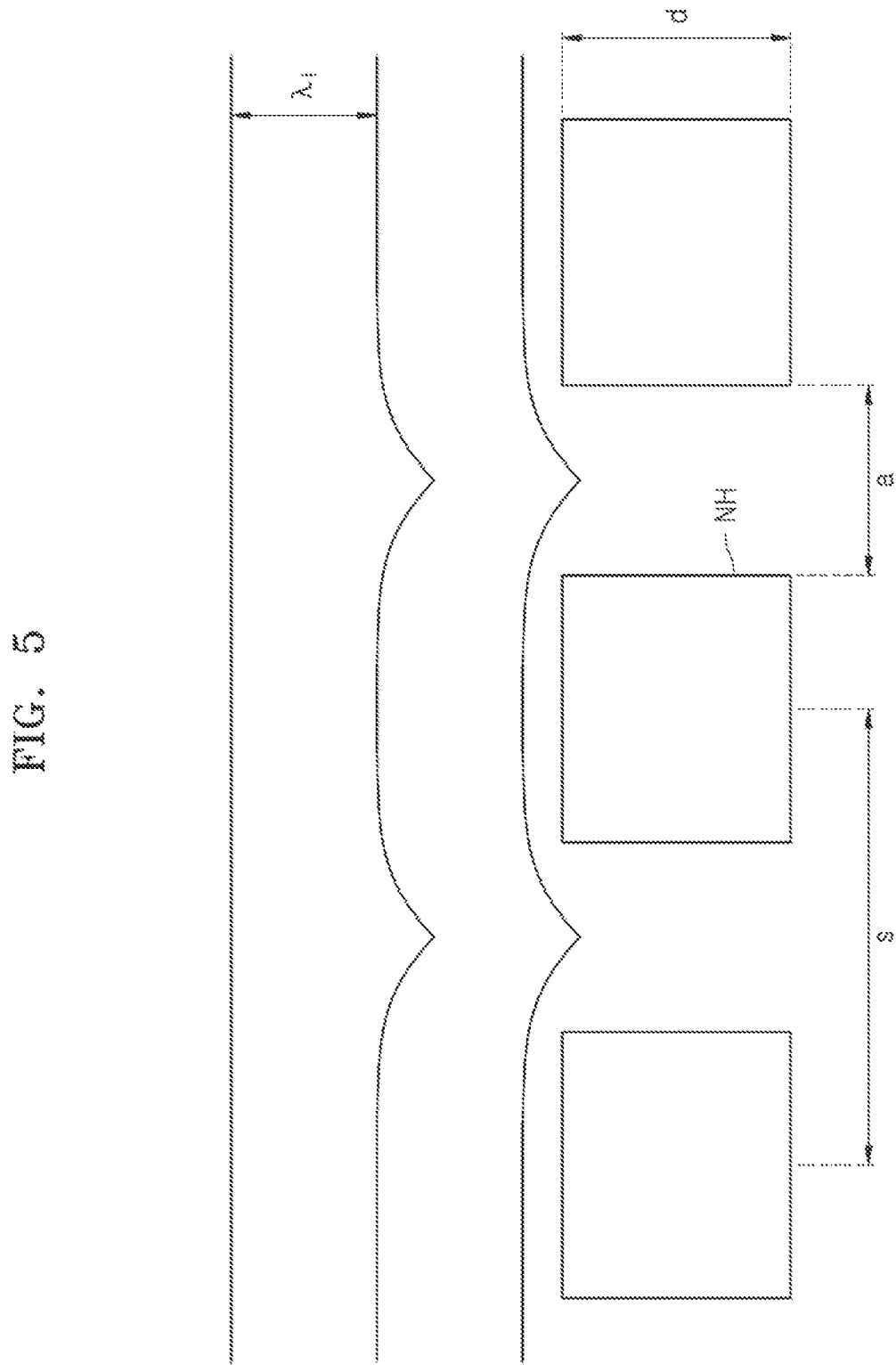
FIG. 5 schematically shows the effect of a plurality of recesses of FIG. 1 on light of a long wavelength.

FIG. 4 schematically shows the effect of the plurality of recesses NH of FIG. 1 on light of a short wavelength $\lambda s$. FIG. 5 schematically shows the effect of the same plurality of recesses NH of FIG. 1 on light of a long wavelength A1. In FIGS. 4 and 5, the plurality of recesses NH may be spaced apart by a predetermined arrangement distance s and may be periodically arranged. In addition, the plurality of recesses NH may have a constant diameter a and depth d. However, the present disclosure is not limited thereto, and the function of the plurality of recesses NH described later may be performed even when the plurality of recesses NH are irregularly arranged and have different diameters a and depths d.

Referring to FIG. 4, when the light (e.g., a blue light) of the short wavelength $\lambda s$ emitted from the white organic emission structure 300 travels and reaches the recess NH of the reflective layer 100, part of the light of the short wavelength $\lambda s$ may propagate into the recess NH. In other words, when the light of the short wavelength $\lambda s$ reaches the recess NH, the part of the light of the short wavelength $\lambda s$ may travel into the recess NH and may not be reflected by the reflective layer 100. Accordingly, the amount of the light of the short wavelength $\lambda s$ reflected by the reflective layer 100 may be reduced.

Referring to FIG. 5, when the light of the long wavelength A1 from the white organic emission structure 300 travels and reaches the recess NH of the reflective layer 100, the light of the long wavelength A1 may be cut off. In other words, the light of the long wavelength A1 does not travel into the recess NH and may thus be reflected by the reflective layer 100.

As described with reference to FIGS. 4 and 5, the amount of light of the short wavelength $\lambda s$ reflected by the reflective layer 100 may be reduced by the recess NH, and accordingly, the resonance of the light of the short wavelength $\lambda s$ between the reflective layer 100 and the second electrode 400 may be reduced. By using this principle, the color purity of the light emitting device 1000 may be improved. For example, referring to FIG. 1 again, the resonance of the light of the short wavelength $\lambda s$ from the white organic emission structure 300 between the first region 101 and the second electrode 400 may be suppressed by the plurality of recesses NH provided in the first region 101 on the surface of the reflective layer 100. Meanwhile, even if the recesses NH are provided, because the amount of light of the long wavelength A1 reflected by the reflective layer 100 is not reduced, the resonance of the light of the long wavelength A1 from the white organic emission structure 300 between the first region 101 and the second electrode 400 may be maintained. Accordingly, the color purity of the light of the long wavelength A1 that resonates between the first region 101 and the second electrode 400 and is emitted to the outside of the second electrode 400 may be improved compared to the case where the recesses NH are not provided in the first region 101 on the surface of the reflective layer 100.

Figure 6:
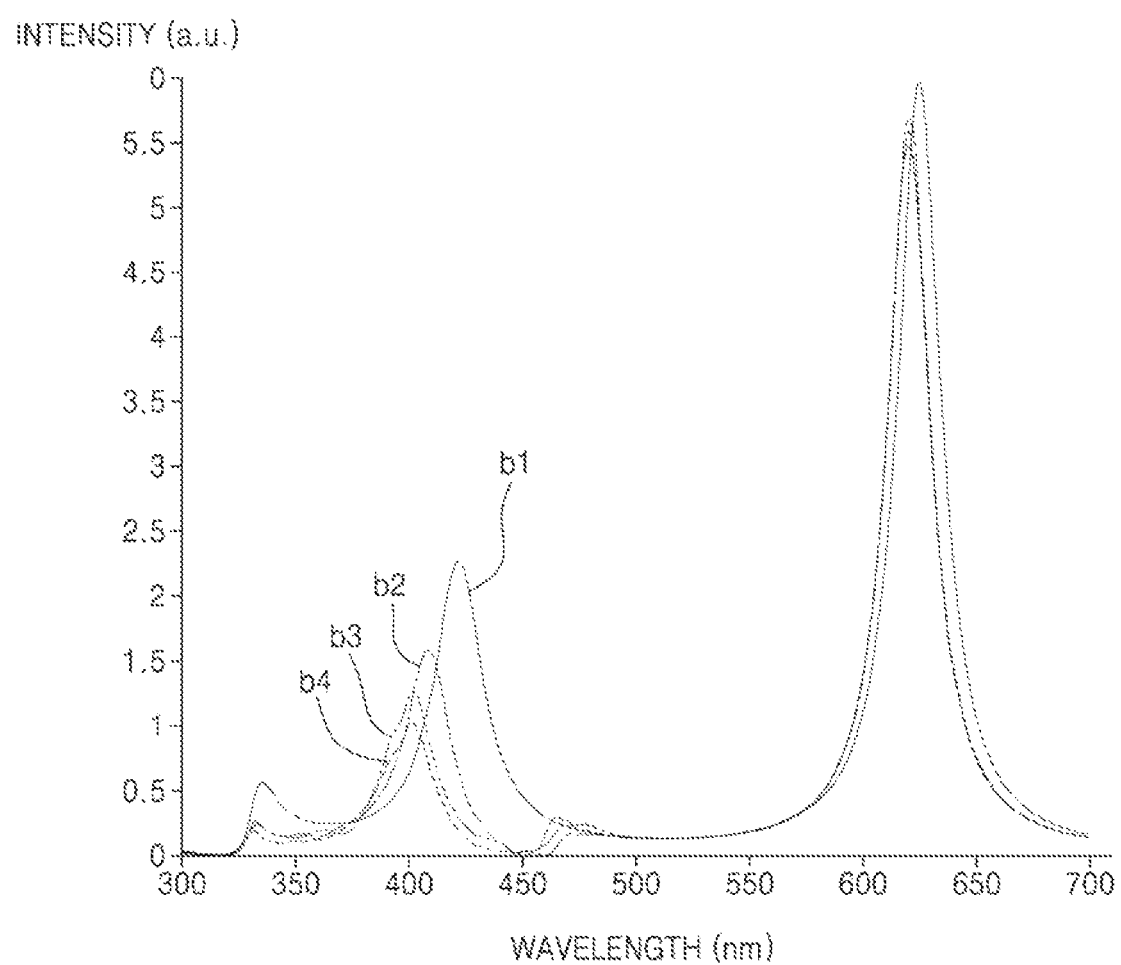
FIG. 6 is a graph showing the intensity characteristics of light that resonates in a micro cavity formed by a first reflective region and a second electrode of FIG. 1 and is emitted through the second electrode.

FIG. 6 is a graph showing the intensity characteristics of light that resonates in a micro cavity formed by the first reflective region 101 and the second electrode 400 of FIG. 1 and is emitted through the second electrode 400. The horizontal axis of the graph of FIG. 6 represents the wavelength of light, and the vertical axis represents the intensity of light. All of a first curve b1, a second curve b2, a third curve b3, and a fourth curve b4 show results when the optical thickness of the micro cavity formed by the first reflective region 101 and the second electrode 400 is determined such that the resonance wavelength of the micro cavity coincides with the center wavelength of a red light. For example, the second curve b2 shows the result when the optical thickness of the micro cavity formed by the first reflective region 101 and the second electrode 400 is about 552 nm. The third curve b3 shows the result when the optical thickness of the micro cavity formed by the first reflective region 101 and the second electrode 400 is about 545 nm. The fourth curve b4 shows the result when the optical thickness of the micro cavity formed by the first reflective region 101 and the second electrode 400 is about 547 nm.

In addition, the first curve b1 shows the intensity characteristic of light when the plurality of recesses NH are not provided in the first reflective region 101 of the surface of the reflective layer 100, and the first reflective region 101 of the surface of the reflective layer 100 is flat. The second curve b2 shows the intensity characteristic of light when the plurality of recesses NH having a diameter of 100 nm, a depth of 60 nm, and an arrangement distance of 150 nm are formed in the first reflective region 101 of the surface of the reflective layer 100. The third curve b3 shows the intensity characteristic of light when the plurality of recesses NH having a diameter of 100 nm, a depth of 100 nm, and an arrangement distance of 100 nm are formed in the first reflective region 101 of the surface of the reflective layer 100. The fourth curve b4 shows the intensity characteristic of light when the plurality of recesses NH having a diameter of 100 nm, a depth of 60 nm, and an arrangement distance of 100 nm are formed in the first reflective region 101 of the surface of the reflective layer 100.

Referring to FIG. 6, in the case of all of the first curve b1, the second curve b2, the third curve b3, and the fourth curve b4, the intensity of the light in a red light region having a wavelength of about 630 nm may be noticeable compared to the intensity of the light in another region. This is because the optical thickness of the micro cavity formed by the first reflective region 101 and the second electrode 400 is determined such that the resonance wavelength of the micro cavity coincides with the center wavelength of the red light. Meanwhile, as shown by the first curve b1, the second curve b2, the third curve b3, and the fourth curve b4, the intensity of light in a blue light region of the wavelength of about 400 nm to about 430 nm may be sequentially weakened. For example, when the first curve b1 is compared with the second, third, and fourth curves b2, b3, and b4, the intensity of the light in the blue light region may be weak in the case where the plurality of recesses NH are provided compared to the case where the plurality of recesses NH are not provided. Furthermore, when comparing the second curve b2, the third curve b3, and the fourth curve b4, it may be seen that as the shape of the recess NH is adjusted, the intensity of the light in the blue light region becomes weaker. As described above, the emission of the blue light from the first micro cavity L1 formed to make the red light resonate may be reduced by the plurality of recesses NH formed in the first reflective region 101 of the surface of the reflective layer 100. Accordingly, the color purity of the light emitting device 1000 including the first micro cavity L1 may be improved.

Figure 7:
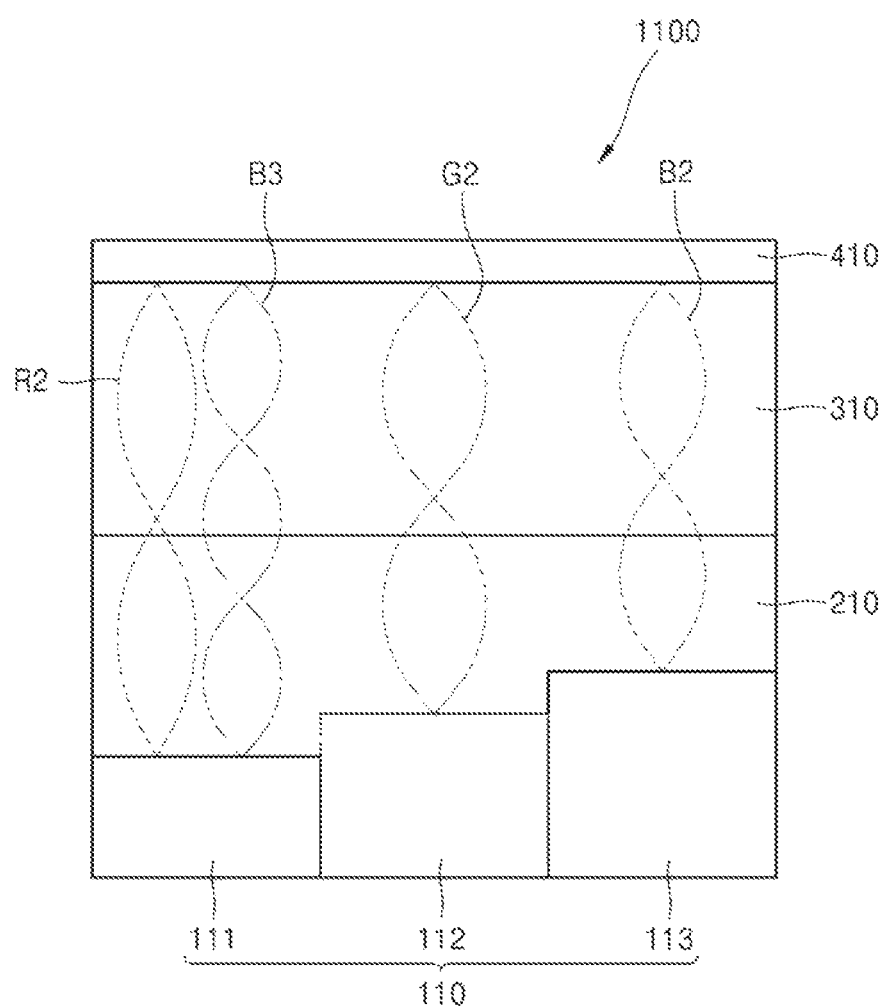
FIG. 7 is a lateral cross-sectional view schematically showing a configuration of a light emitting device including a reflective layer having a step-shaped surface having no recess according to an embodiment.
Figure 8:
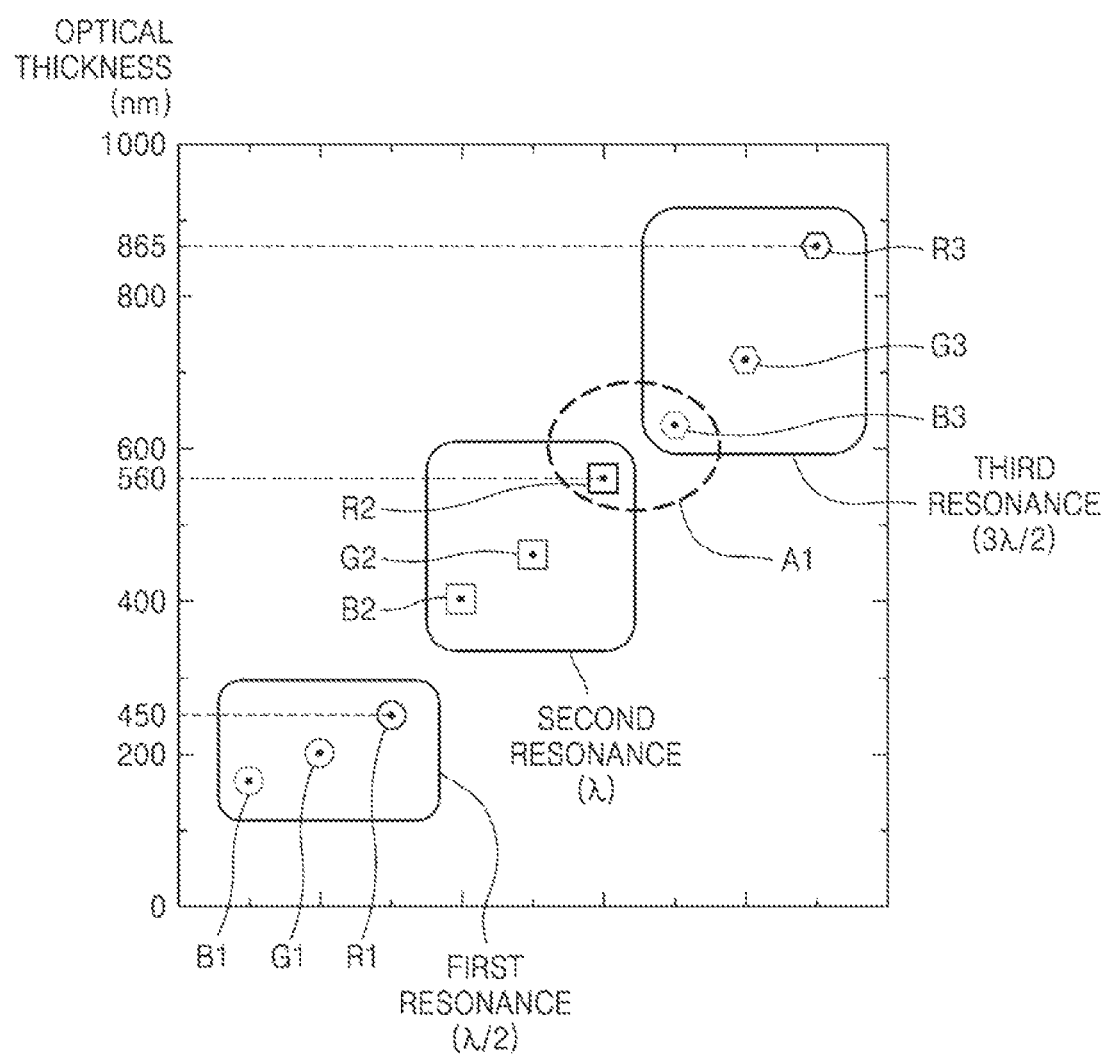
FIG. 8 is a resonance mapping according to the optical thickness (nm) of a micro cavity formed by each of first, second, and third reflective regions of a reflective layer and a second electrode.

FIG. 7 is a lateral cross-sectional view schematically showing a configuration of a light emitting device 1100 including the reflective layer 110 having a step-shaped surface without any recesses according to an embodiment. FIG. 8 is a resonance mapping according to the optical thickness (nm) of a micro cavity formed by each of first, second and third reflective regions 111, 112, and 113 of the reflective layer 110 and the second electrode 410. The light emitting device 1100 of FIG. 7 may be substantially the same as the light emitting device 1000 of FIG. 1 except that the reflective layer 110 does not include a plurality of recesses. The description of FIG. 7 redundant with that of FIG. 1 is omitted.

Referring to FIG. 7, the light emitting device 1100 may include a first electrode 210, a white organic emission structure 310 provided on the first electrode 210, a second electrode 410 provided on the white organic emission structure 310 and a reflective layer 110 provided below the first electrode 210 and including the first reflective region 111, the second reflective region 112, and the third reflective region 113 having different heights to form different separation distances from the second electrode 410.

Referring to FIG. 7, a second resonance R2 of a red light and a third resonance B3 of a blue light may occur between the first reflective region 111 and the second electrode 410 of the light emitting device 1100. A second resonance G2 of a green light may occur between the second reflective region 112 and the second electrode 410 of the light emitting device 1100. A second resonance B2 of the blue light may occur between the third reflective region 113 and the second electrode 410 of the light emitting device 1100.

Referring to FIG. 8, when the optical thickness of the micro cavity is within the range of about 180 nm to about 450 nm, a first resonance R1 of the red light, a first resonance G1 of the green light, and a first resonance B1 of the blue light may occur. In this case, the first resonance means resonance that occurs when the optical thickness of the micro cavity coincides with the half wavelength $\lambda/2$ of light. For example, the first resonance R1 of the red light may occur when the optical thickness of the micro cavity is about 450 nm. In addition, the first resonance G1 of the green light may occur when the optical thickness of the micro cavity is about 250 nm. Furthermore, the first resonance B1 of the blue light may occur when the optical thickness of the micro cavity is about 180 nm.

Meanwhile, when the optical thickness of the micro cavity is in the range of about 400 nm to about 560 nm, the second resonance R2 of the red light, the second resonance G2 of the green light, and the second resonance B2 of the blue light may occur. In this case, the second resonance means resonance that occurs when the optical thickness of the micro cavity coincides with the wavelength A of light. For example, the second resonance R2 of the red light may occur when the optical thickness of the micro cavity is about 560 nm. In addition, the second resonance G2 of the green light may occur when the optical thickness of the micro cavity is about 430 nm. Furthermore, the second resonance B2 of the blue light may occur when the optical thickness of the micro cavity is about 400 nm.

Furthermore, when the optical thickness of the micro cavity is in the range of about 610 nm to about 865 nm, a third resonance R3 of the red light, a third resonance G3 of the green light, and the third resonance B3 of the blue light may occur. In this case, the third resonance means resonance that occurs when the optical thickness of the micro cavity coincides with three times the half wavelength 3*λ/2 of light. For example, the third resonance R3 of the red light may occur when the optical thickness of the micro cavity is about 865 nm. In addition, the third resonance G3 of the green light may occur when the optical thickness of the micro cavity is about 700 nm. Furthermore, the third resonance B3 of the blue light may occur when the optical thickness of the micro cavity is about 610 nm.

In particular, in a region A1 in which the optical thickness of the micro cavity is in the range of about 560 nm to about 610 nm, the second resonance R2 of the red light and the third resonance B3 of the blue light may simultaneously occur. This phenomenon may be the same as the resonance phenomenon occurring between the first reflective region 111 and the second electrode 410 of FIG. 7. For example, not only the red light but also the blue light may resonate in the micro cavity formed by the first reflective region 111 and the second electrode 410 in which the red light is intended to resonate. Accordingly, the red color purity of the light emitting device 1100 may be reduced.

Figure 9:
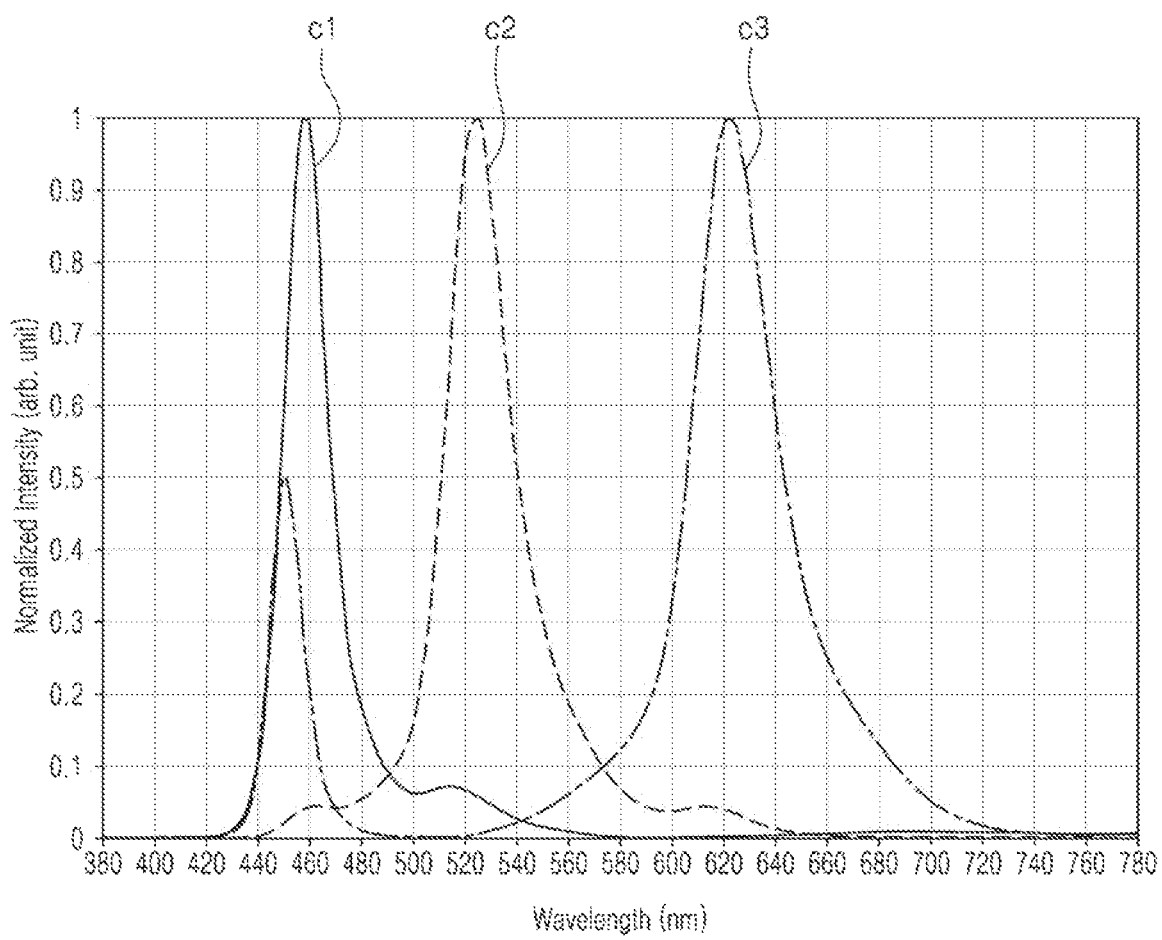
FIG. 9 is a graph showing the intensity of light emitted from the light emitting device of FIG. 7 for each wavelength.

FIG. 9 is a graph showing the intensity of light emitted from the light emitting device 1100 of FIG. 7 for each wavelength. A first curve c1 shows the intensity of light resonating between the third reflective region 113 and the second electrode 410 and then emitted to the second electrode 410. A second curve c2 shows the intensity of light resonating between the second reflective region 112 and the second electrode 410 and then emitted to the second electrode 410. A third curve c3 shows the intensity of light resonating between the first reflective region 111 and the second electrode 410 and then emitted to the second electrode 410.

Referring to FIG. 9, as shown in the first curve c1, most of the light resonating between the third reflective region 113 and the second electrode 410 and then emitted to the second electrode 410 may be the light of a blue light region. In addition, as shown in the second curve c2, most of the light resonating between the second reflective region 112 and the second electrode 410 and then emitted to the second electrode 410 may be the light in a green light region.

However, as shown in the third curve c3, the light resonating between the first reflective region 111 and the second electrode 410 and then emitted to the second electrode 410 may be a mixture of lights of the red and blue light regions. This is because, as described with reference to FIGS. 7 and 8, the second resonance of the red light and the third resonance of the blue light may simultaneously occur between the first reflective region 111 and the second electrode 410.

The light emitting device 1000 of FIG. 1 including the plurality of recesses NH formed in the first reflective region 101 of the surface of the reflective layer 100 may have more improved color purity than the light emitting device 1100 of FIG. 7. This is because, as described above, the plurality of recesses NH may reduce the emission of the blue light from the first micro cavity L1.

Figure 10:
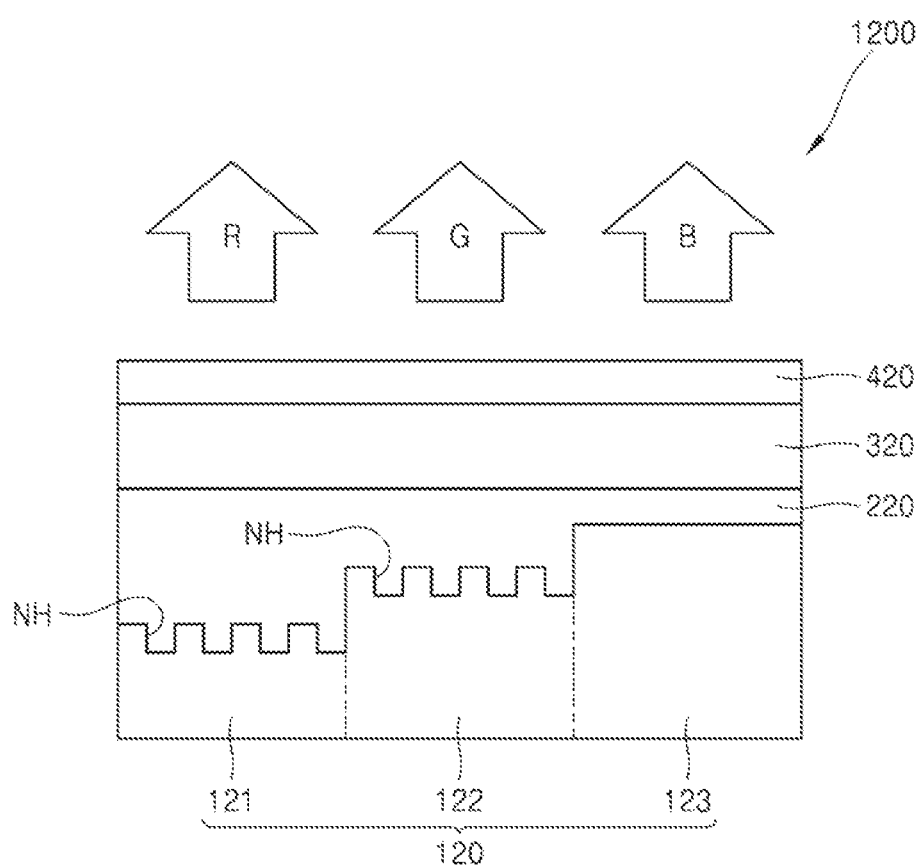
FIG. 10 is a lateral cross-sectional view schematically showing a structure of a light emitting device according to an embodiment.

FIG. 10 is a lateral cross-sectional view schematically showing a configuration of a light emitting device 1200 according to embodiment. The light emitting device 1200 of FIG. 10 may be substantially the same as the light emitting device 1000 of FIG. 1, except that a second reflective region 122 includes the plurality of recesses NH. In describing FIG. 10, a redundant description with that of FIG. 1 is omitted.

Referring to FIG. 10, the light emitting device 1200 may include a first electrode 220, a white organic emission structure 320 provided on the first electrode 220, a second electrode 420 provided on the white organic emission structure 320 and a reflective layer 120 provided below the first electrode 220. The reflective layer 120 may include a first reflective region 121, the second reflective region 122, and a third reflective region 123 having different heights to form different separation distances from the second electrode 420.

Among the first reflective region 121, the second reflective region 122 and the third reflective region 123, the plurality of recesses NH may be provided in the first reflective region 121 and the second reflective region 122. Accordingly, the plurality of recesses NH may not be provided in the third reflective region 123.

A second resonance of a green light may occur in a micro cavity formed by the second reflective region 122 and the second electrode 420. In addition, at the same time, a second resonance of a blue light may also occur. The plurality of recesses NH provided in the second reflective region 122 of the surface of the reflective layer 120 may suppress the second resonance of the blue light that may occur between the second reflective region 122 and the second electrode 420. Accordingly, the color purity of a green light resonating in the micro cavity formed by the second reflective region 122 and the second electrode 420 and emitted through the second electrode 420 may be improved.

Figure 11:
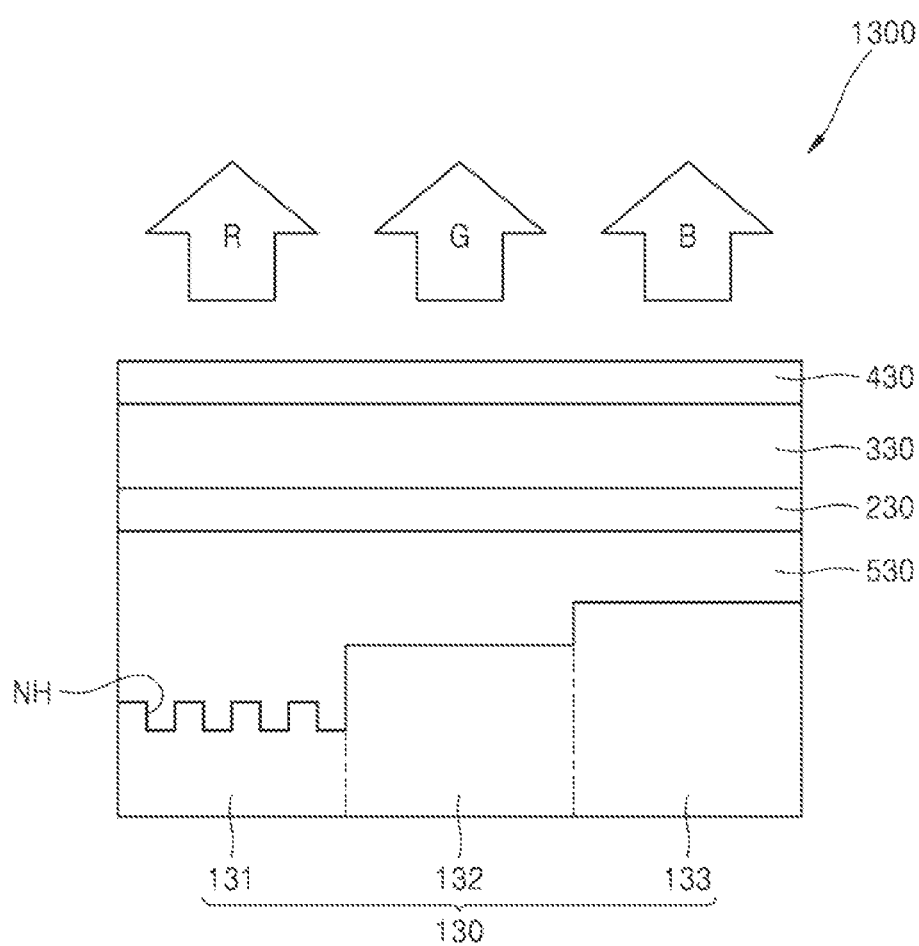
FIG. 11 is a lateral cross-sectional view schematically showing a structure of a light emitting device according to an embodiment.

FIG. 11 is a lateral cross-sectional view schematically showing a structure of a light emitting device 1300 according to an embodiment. The light emitting device 1300 of FIG. 11 may be substantially the same as the light emitting device 1000 of FIG. 1, except that a dielectric layer 530 is further provided between a reflective layer 130 and a first electrode 230. In describing FIG. 11, a redundant description with FIG. 1 is omitted.

Referring to FIG. 11, the light emitting device 1300 may include the first electrode 230, a white organic emission structure 330 provided on the first electrode 230, a second electrode 430 provided on the white organic emission structure 330 and the reflective layer 130 provided below the first electrode 230. The reflective layer 130 may include a first reflective region 131, a second reflective region 132, and a third reflective region 133 having different heights to form different separation distances from the second electrode 430.

The dielectric layer 530 may be further provided between the reflective layer 130 and the first electrode 230 and formed to fill the periphery of the plurality of recesses NH provided on the first reflective region 131 of the surface of the reflective layer 130.

Figure 12:
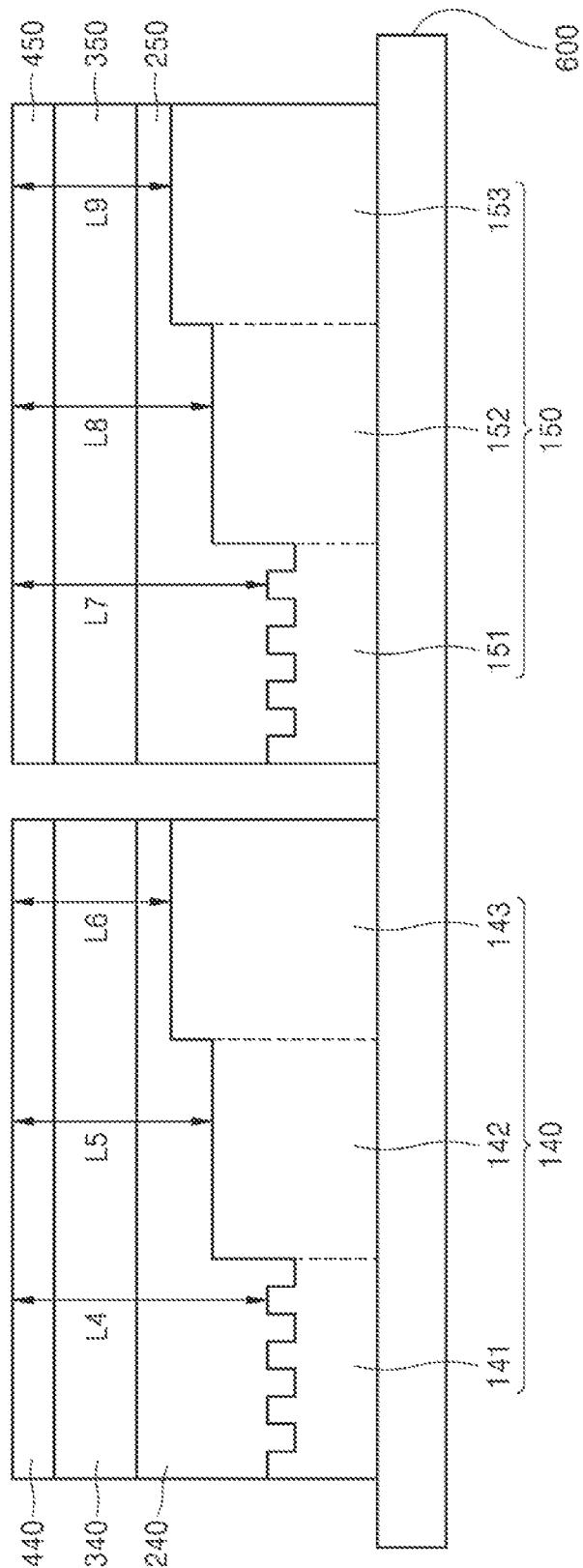
FIG. 12 is a lateral cross-sectional view schematically showing a structure of a display apparatus according to an embodiment.

FIG. 12 is a lateral cross-sectional view schematically showing a structure of a display apparatus 2000 according to an embodiment.

Referring to FIG. 12, the display apparatus 2000 may include a plurality of pixels including a first pixel P1 and a second pixel P2. Although two pixels of the first pixel P1 and the second pixel P2 are illustrated in FIG. 12, the display apparatus 2000 may include a large number of pixels. The first pixel P1 and the second pixel P2 may be provided on a substrate 600. The first pixel P1 and the second pixel P2 may include any one or more of the light emitting devices 1000, 1100, 1200, and 1300 described with reference to FIGS. 1 to 11.

For example, the first pixel P1 may include a first electrode 240, a white organic emission structure 340 provided on the first electrode 240, a second electrode 440 provided on the white organic emission structure 340, and a reflective layer 140 provided below the first electrode 240. The reflective layer 140 may include a first reflective region 141, a second reflective region 142 and a third reflective region 143 having different heights to form different separation distances from the second electrode 440. The first reflective region 141 and the second electrode 440 may form a first micro cavity L4. The second reflective region 142 and the second electrode 440 may form a second micro cavity L5. The third reflective region 143 and the second electrode 440 may form a third micro cavity L6.

The second pixel P2 may include a first electrode 250, a white organic emission structure 350 provided on the first electrode 250, a second electrode 450 provided on the white organic emission structure 350, and a reflective layer 150 provided below the first electrode 250. The reflective layer 150 may include a first reflection region 151, a second reflection region 152, and a third reflection region 153 having different heights to form different separation distances from the second electrode 450. The first reflective region 151 and the second electrode 450 may form a first micro cavity L7. The second reflective region 152 and the second electrode 450 may form a second micro cavity L8. The third reflective region 153 and the second electrode 450 may form a third micro cavity L9.

The display apparatus 2000 may further include a driver for driving the first pixel P1 and the second pixel P2.

A plurality of recesses are provided in at least one of a plurality of micro cavity structures of different lengths according to the present disclosure, and thus a W-OLED with the improved color purity may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light emitting device comprising:
    a first electrode;
    a white organic light emission structure provided on the first electrode;
    a second electrode provided on the white organic light emission structure; and
    a reflective layer provided on an opposite side of the first electrode from the white organic light emission structure, the reflective layer comprising a first reflective region, a second reflective region, and a third reflective region having different heights from one another and forming different separation distances from the second electrode,
    wherein a plurality of recesses are formed on an upper surface of the reflective layer in at most two of the first reflective region, the second reflective region, and the third reflective region, and
    wherein the first electrode is provided on the upper surface of the reflective layer,
    wherein for each recess of the plurality of recesses, a diameter of a top portion of the recess is substantially equal to a diameter of a bottom portion of the recess, and wherein a period between each of the recesses is constant in the at most two of the first reflective region, the second reflective region, and the third reflective region in which the plurality of recesses are formed.

2. The light emitting device of claim 1, wherein a height of the first reflective region is lower than a height of the second reflective region, and a height of the second reflective region is lower than a height of the third reflective region.

3. The light emitting device of claim 2, wherein the plurality of recesses are provided in the first reflective region.

4. The light emitting device of claim 3, wherein the plurality of recesses are provided in the second reflective region.

5. The light emitting device of claim 2, wherein a size of each of the plurality of recesses is less than a wavelength of a light generated from the white organic light emission structure.

6. The light emitting device of claim 2, wherein adjacent recesses of the plurality of recesses are periodically arranged and are spaced apart from each other by a predetermined arrangement distance in a direction along the surface of the reflective layer.

7. The light emitting device of claim 6, wherein a depth of each of the plurality of recesses is less than the predetermined arrangement distance between the adjacent recesses of the plurality of recesses.

8. The light emitting device of claim 2, wherein a depth of each of the plurality of recesses is about 10 nm to about 100 nm.

9. The light emitting device of claim 2, wherein a diameter of each of the plurality of recesses is about 100 nm.

10. The light emitting device of claim 2, wherein an arrangement period of the plurality of recesses is about 100 nm to about 150 nm.

11. The light emitting device of claim 2, wherein a dielectric layer is further provided between the reflective layer and the first electrode.

12. The light emitting device of claim 11, wherein the dielectric layer fills a periphery of the plurality of recesses.

13. The light emitting device of claim 1, wherein the first electrode comprises a transparent electrode, and
    wherein the second electrode comprises a semi-transmissive electrode that reflects part of incident light and transmits the remaining part of the incident light.

14. The light emitting device of claim 13, wherein the second electrode comprises a reflective metal, and a thickness of the second electrode is about 10 nm to about 20 nm.

15. The light emitting device of claim 1, wherein the first electrode comprises a transparent electrode and the second electrode comprises a reflective electrode, and
    wherein the reflective layer comprises a semi-transmissive layer that reflects part of incident light and transmits the remaining part of the incident light.

16. The light emitting device of claim 1, wherein the reflective layer comprises silver (Ag) or an alloy containing silver.

17. The light emitting device of claim 1, wherein the white organic light emission structure comprises:
a hole injection layer provided on the first electrode;
a hole transport layer provided on the hole injection layer;
a white organic light emission layer provided on the hole transport layer;
an electron transport layer provided on the white organic light emission layer; and
an electron injection layer provided on the electron transport layer.

18. The light emitting device of claim 17, wherein the white organic light emission layer comprises:
a first organic light emission layer emitting light of a first wavelength;
a second organic light emission layer provided on the first organic light emission layer and emitting light of a second wavelength; and
a third organic light emission layer provided on the second organic light emission layer and emitting light of a third wavelength.

19. A display apparatus comprising a plurality of pixels, wherein each of the plurality of pixels comprises:
a first electrode;
a white organic light emission structure provided on the first electrode;
a second electrode provided on the white organic light emission structure; and
a reflective layer provided on an opposite side of the first electrode from the white organic light emission structure, the reflective layer comprising a first reflective region, a second reflective region, and a third reflective region having different heights from one another and forming different separation distances from the second electrode,
wherein a plurality of recesses are formed on an upper surface of the reflective layer in at most two of the first reflective region, the second reflective region, and the third reflective region, and
wherein the first electrode is provided on the upper surface of the reflective layer,
wherein for each recess of the plurality of recesses, a diameter of a top portion of the recess is substantially equal to a diameter of a bottom portion of the recess, and wherein a period between each of the recesses is constant in each of the at most two of the first reflective region, the second reflective region, and the third reflective region in which the plurality of recesses are formed.

20. A light emitting device comprising:
a first electrode;
a second electrode provided on one side of the first electrode; and
a reflective layer provided on an opposite side of the first electrode from the one side, the reflective layer comprising a first region, a second region, and a third region,
wherein a first distance between the second electrode and the first region of the reflective layer is greater than a second distance between the second electrode and the second region of the reflective layer and a third distance between the second electrode and the third region is greater than the second distance,
wherein a plurality of recesses are formed on an upper surface of the reflective layer in at most two of the first region, the second region, and the third region, and
wherein the first electrode is provided on the upper surface of the reflective layer,
wherein for each recess of the plurality of recesses, a diameter of a top portion of the recess is substantially equal to a diameter of a bottom portion of the recess, and wherein a period between each of the recesses is constant in each of the at most two of the first region, the second region, and the third region in which the plurality of recesses are formed.

21. The light emitting device of claim 20, further comprising a light emission layer provided between the first electrode and the second electrode, the light emission layer being configured to emit light having a plurality of wavelengths.

22. The light emitting device of claim 21, wherein the first distance corresponds to a first resonance of a first portion of the emitted light having a first wavelength and the second distance corresponds to a second resonance of a second portion of the emitted light having a second wavelength different from the first wavelength.

23. The light emitting device of claim 20, wherein the emitted light having a first wavelength is reflected by the reflective layer without propagating into the plurality of recesses, and
wherein the emitted light having a second wavelength propagates into the plurality of recesses without being reflected by the reflective layer.

* * * * *